United States Patent [19]

Ogusu et al.

[11] Patent Number: 6,083,650
[45] Date of Patent: Jul. 4, 2000

[54] DEVICE MANUFACTURING METHOD UTILIZING CONCENTRIC FAN-SHAPED PATTERN MASK

[75] Inventors: Makoto Ogusu; Kenji Saitoh, both of Utsunomiya, Japan

[73] Assignee: Canon Kabushiki Kaisha, Tokyo, Japan

[21] Appl. No.: 09/105,047

[22] Filed: Jun. 26, 1998

[30] Foreign Application Priority Data

Jun. 27, 1997 [JP] Japan ................................ 9-187376

[51] Int. Cl.$^7$ ........................................................ G03F 9/00
[52] U.S. Cl. ........................ 430/22; 430/302; 430/311; 430/321
[58] Field of Search .................................. 430/5, 22, 30, 430/302, 321, 311

[56] References Cited

U.S. PATENT DOCUMENTS

| | | | |
|---|---|---|---|
| 4,895,790 | 1/1990 | Swanson et al. | 430/321 |
| 5,156,943 | 10/1992 | Whitney | 430/321 |
| 5,483,343 | 1/1996 | Iwamoto et al. | 356/351 |

FOREIGN PATENT DOCUMENTS

| | | |
|---|---|---|
| 64-72101 | 3/1989 | Japan. |
| 6-252027 | 9/1994 | Japan. |
| 6-265708 | 9/1994 | Japan. |

*Primary Examiner*—Christopher G. Young
*Attorney, Agent, or Firm*—Fitzpatrick, Cella, Harper & Scinto

[57] ABSTRACT

A method of manufacturing an element with a concentric pattern by use of a photolithographic process is disclosed, wherein the method includes preparing masks having segment patterns corresponding to fan-shaped regions, respectively, of the pattern which fan-shaped regions can be defined by dividing the pattern by at least one circle concentric with the pattern to provide plural zones and then by dividing each zone equiangularly, and-exposing regions of a substrate corresponding to the plural zones, respectively, by using the masks corresponding to the zones, respectively, while rotating the substrate by regular angles.

7 Claims, 7 Drawing Sheets

DEVICE MANUFACTURING METHOD UTILIZING CONCENTRIC FAN-SHAPED PATTERN MASK

FIELD OF THE INVENTION AND RELATED ART

This invention relates to a device manufacturing method and apparatus particularly suitable for manufacture of a diffractive optical element for use In an optical system in various applications such as a semiconductor device manufacturing exposure apparatus, a camera, a telescope or a microscope, for example.

A diffractive optical element, called a binary optical element (BOE), having a rating section of multi-stage like shape, can be produced by using a photolithographic process similar to that used among semiconductor device manufacturing processes.

Japanese Laid-Open Patent Application, Laid-Open No. 252027/1994 shows a photolithographic process wherein, after positioning a substrate on the basis of alignment marks formed thereon, a desired pattern is printed on a photosensitive layer on the substrate.

Japanese Laid-Open Patent Application, Laid-Open No. 72101/1989 shows an arrangement such as illustrated in FIG. 8 of the drawings, wherein a rotary encoder 2 is coupled to a rotary stage 1 on which a substrate is placed. Disposed above the stage 1 is energy beam projecting means 3. Control means 4 controls the whole system, and its output is connected to straight driving means 5 and rotary driving means 6 for the stage 1. The output of the rotary driving means 6 is connected to the rotary encoder 2. The output of the control means 4 and the output of the rotary encoder 2 are-connected to angle consistency discriminating means 7 and revolution consistency discriminating means 8. The outputs of the angle consistency discriminating means 7 and of the revolution consistency discriminating means 8 are connected to the energy beam projecting means 3 by way of blanking signal output means 9.

In operation, an energy beam is projected to the substrate while rotating the rotary stage 1, whereby a photosensitive layer on the substrate 1 is exposed with a single ring-like pattern. The rotary stage 1 is moved straight sequentially by predetermined distances (of different amounts), in the diametrical direction of the rotary stage 1, and during this period the energy beam is flickered with which the rotating substrate is exposed, such that concentric patterns are formed on the substrate.

In this procedure, concentric patterns are formed one by one. Thus, if the number of ring-like patterns of concentric shape is large, a long exposure time is necessary. In order to reduce the exposure time, the substrate rotating speed has to be increased, or a photosensitive material of higher sensitivity has to be used. Alternatively, the intensity of exposure light has to be enlarged. This requires extremely high control precision which leads to a technical difficulty.

SUMMARY OF THE INVENTION

It is an object of the present invention to provide a device manufacturing method and/or apparatus by which a large size element, such as an optical element, can be produced in a reduced time period.

In accordance with an aspect of the present invention, there is provided a method of manufacturing an element with a concentric pattern by use of a photolithographic process, said method comprising the steps of: preparing masks having segment patterns corresponding to fan-shaped regions, respectively, of the pattern which fan-shaped regions can be defined by dividing the pattern by at least one circle concentric with the pattern to provide plural zones and then by dividing each zone equiangularly; and exposing regions of a substrate corresponding to said plural zones, respectively, by using the masks corresponding to said zones, respectively, while rotating the substrate by regular angles.

Based on a unique and improved manufacturing method as described just above, the present invention provides an improved apparatus for manufacturing an element, an improved optical element, an improved optical system, an improved exposure apparatus or an improved device manufacturing method.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

The present invention will be described in detail with reference to preferred embodiments and in conjunction with FIGS. 1–7.

Figure 1:
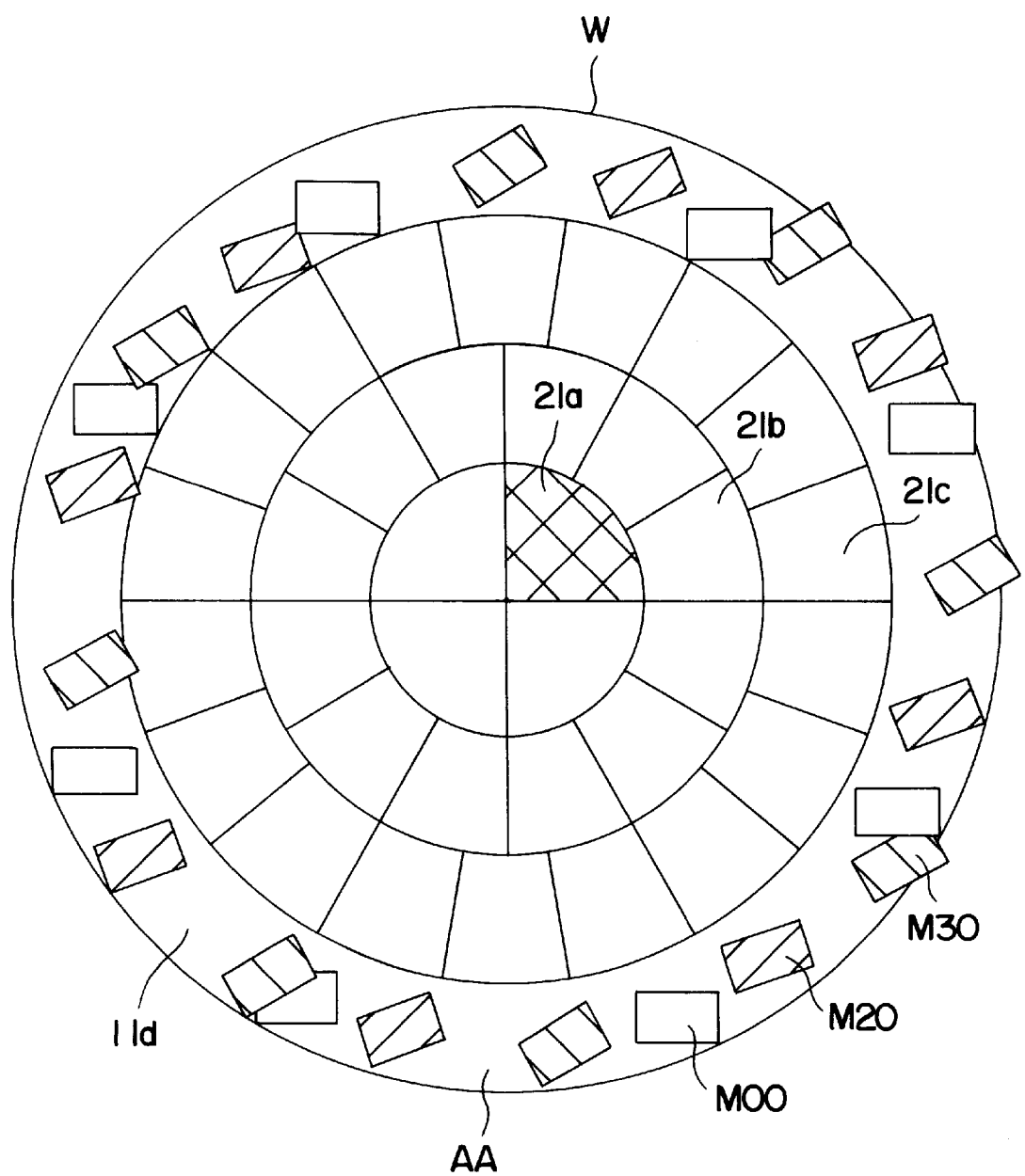
FIG. 1 is a schematic and plane view of a substrate in a first embodiment of the present invention.

FIG. 1 is a schematic and plan view of a substrate in a first embodiment of the present invention. Taking into account the revolutionary symmetry of a diffractive optical element, a main region of a substrate W is trisected by circles concentric with the center of the diffractive optical element, along a radial direction from the center, into one circular region and two ring-like regions. At a peripheral portion of the outermost ring-like region, a ring-like mark region AA is defined in which alignment marks are to be formed. The one circular region and the two ring-like region are divided into four portions, twelve portions and eighteen portions, respectively, by straight lines extending radially of the concentric patterns, whereby exposure regions (shot regions) 21a, exposure regions 21b and exposure regions 21c are defined along circumferential directions of the substrate. This enables sequential exposures of exposure regions 21a, 21b or 21c with one and the same pattern, by using a mask pattern (grating pattern) of an outside shape analogous to each exposure region, while rotating the substrate W in its circumferential direction. In this specification, the shape of the region 21a as well as the shape of the region 21b or 21c will be referred to as a fan-like shape.

For good precision alignment between mask pattern and exposure region, the outside peripheral region AA is formed with alignment marks M each having an edge which is to be oriented in predetermined direction as the substrate W is rotated. FIG. 1 shows typical examples, that is, zero-degree alignment marks $M_{00}$, 20-degree alignment marks $M_{20}$, and 30-degree alignment marks $M_{30}$. Because of schematic illustration, some of these alignment marks are mutually overlapped.

In an occasion where the boundary between the exposure regions 21a–21c is positioned upon a resist-removal pattern, there is a possibility of alignment error produced. In consideration of this, these exposure regions are determined so that overlapping portions of an amount not greater than 100 nm, which is larger than the alignment precision, are defined between the exposure region groups 21a and 21b, and between the groups 21b and 21c in the radial direction.

Figure 2:
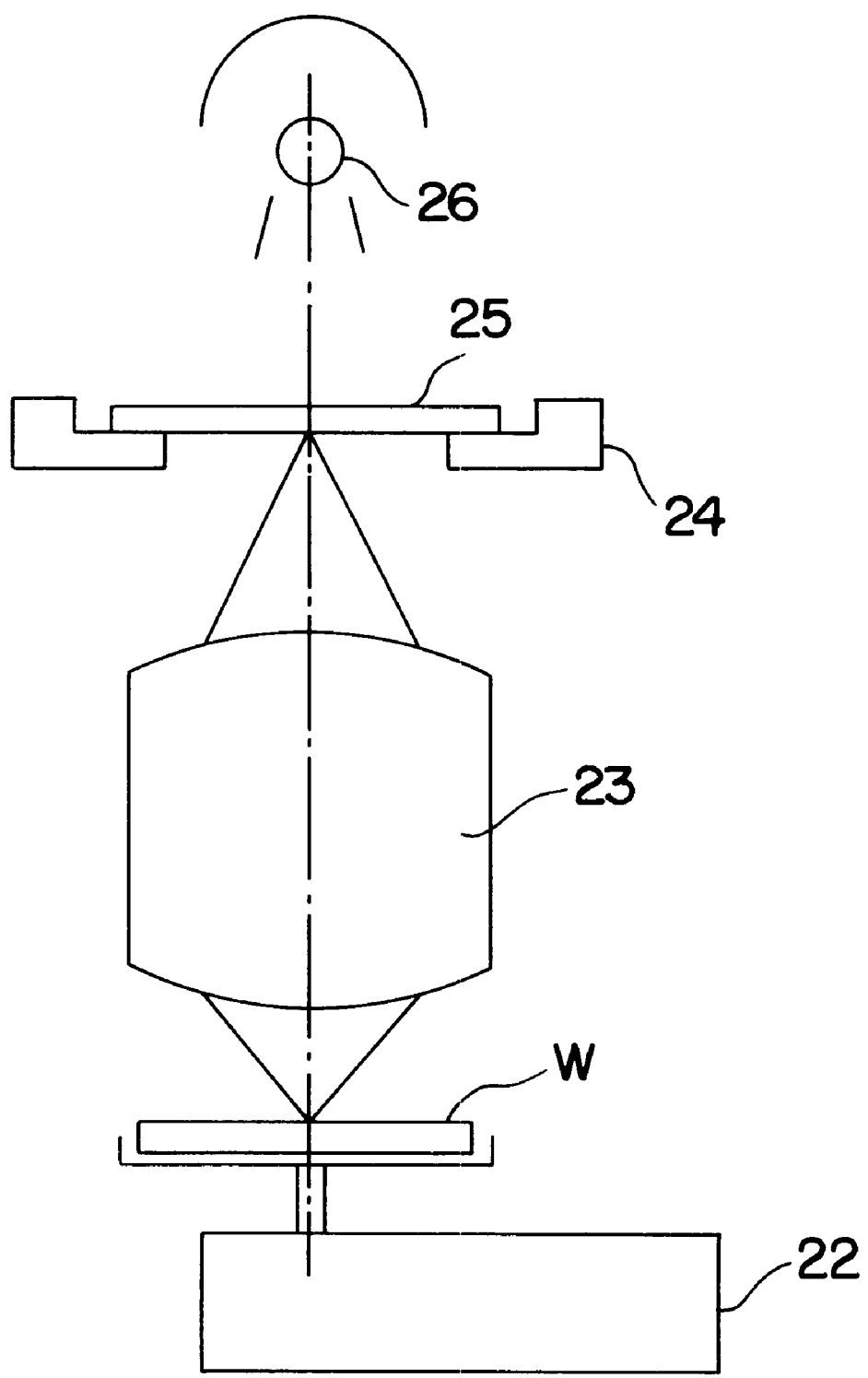
FIG. 2 is a schematic view of an exposure apparatus in the first embodiment of the present invention.
Figure 3:
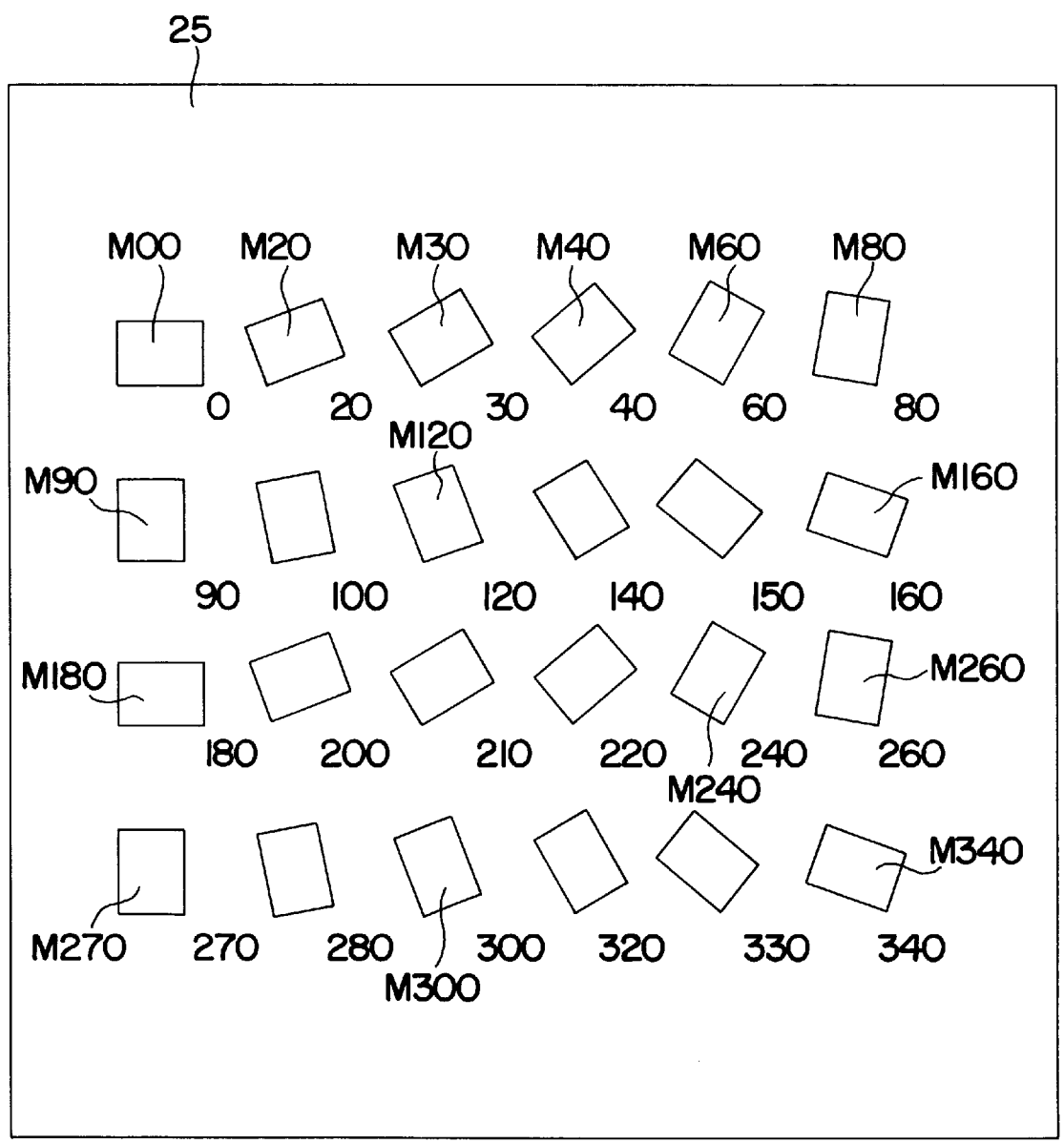
FIG. 3 is a schematic and plan view of a reticle in the first embodiment of the present invention.
Figure 4:
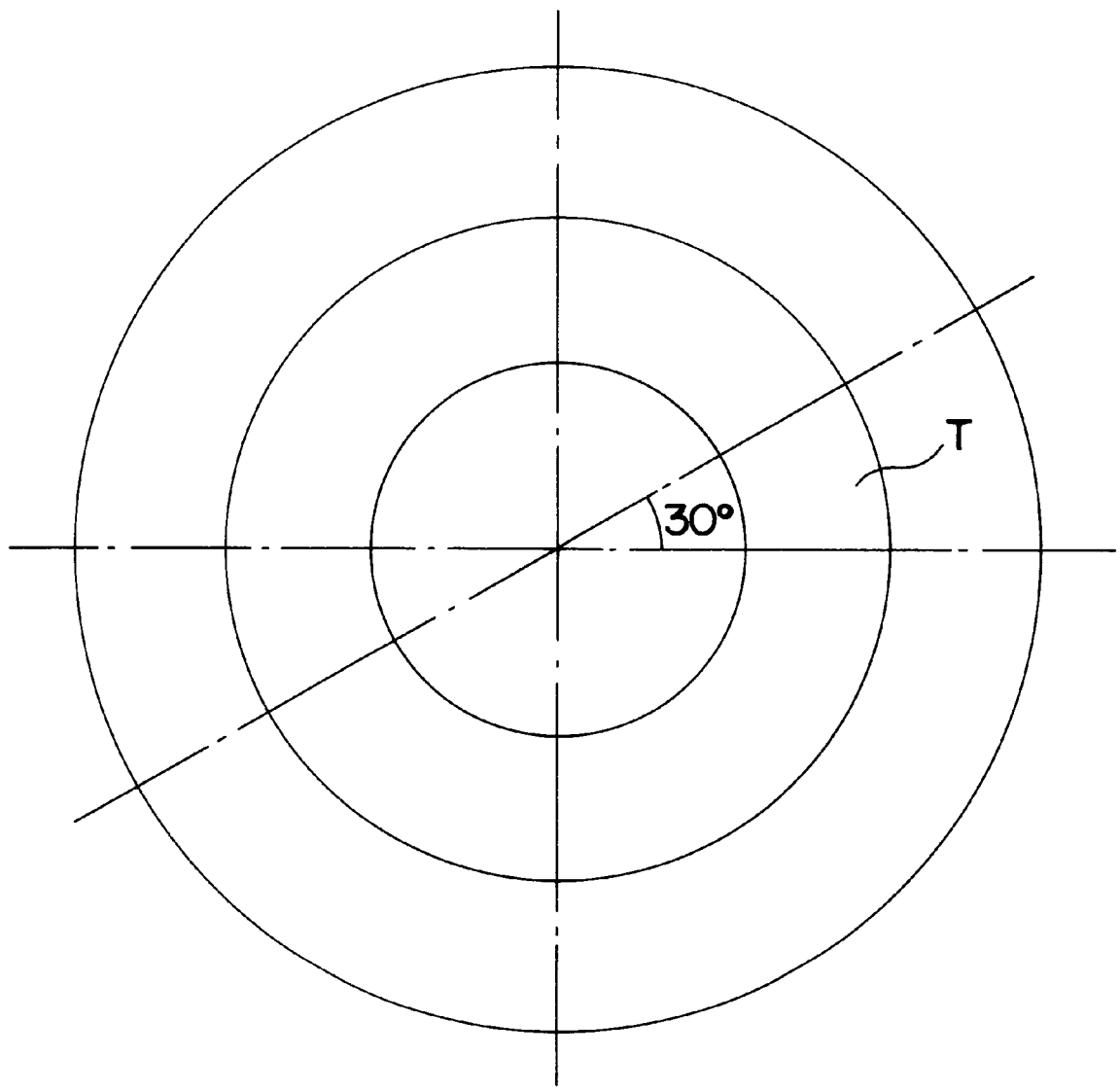
FIG. 4 is a schematic view for explaining an exposure region in the first embodiment of the present invention.

FIG. 2 Is a schematic view of an exposure apparatus used in manufacture of a large diameter element having concentric pattern, in accordance with a lithographic process. A substrate W is placed on a stage 22. Above the stage 22, there are a reticle 25, held by a reticle holding table 24, and a light source 26 which are disposed in this order. FIG. 3 is a plan view of the reticle (mask) 25. As zero layer, there are alignment marks $M_{00}$–$M_{340}$ which are rotationally displaced in counterclockwise direction, in accordance with rotational angles of the substrate.

In an example where a diffractive optical element of a diameter 120 mm is to be exposed in the unit of 22 mm square, for the patterning of a single layer, three regions 21a–21c (FIG. 1) along the radial direction are necessary. Here, as the substrate W is seen from the above, the reticle 25 is formed at a portion as defined rightwardly and upwardly of the center of FIG. 1 and as encircled by a thick line. At this position, while rotating the substrate clockwise by unit angles, sequential exposures are made until one complete turn is accomplished. The rotation angles of the substrate W for this patterning are 90 degrees, 30 degrees and 20 degrees, in the order of exposure regions 21a, 21b and 21c from the center.

First, alignment marks are formed. By using the reticle 25, alignment marks of the respective angular components are printed in the peripheral edge region of the substrate W; eight marks per one rotational angle. Symmetry may be acceptable depending on the shape of alignment mark and, therefore, a single alignment mark may be used for different rotational angles. An alignment mark with an angle to be exposed may be selected by use of a blade, and it may be printed at a predetermined position. Predetermined process or processes may be executed to it, whereby a desired alignment mark may be produced.

Then, an exposure operation is done by use of three types of grating patterns corresponding to the exposure regions 21a–21c. Now, with reference to FIG. 4, an operation for printing, by exposure, a reticle pattern at a position T (the position where the region 21 is be placed) in a upper right portion of the substrate W as seen from the above, will be described. The reticle 25 of this embodiment is able to perform exposure (printing) of a pattern of a radius of about 22–41 mm. Since there are eight alignment marks $M_{00}$ for zero-degree rotational angle already formed in the peripheral edge portion of the substrate W, general alignment is then made by using these eight alignment marks $M_{00}$.

Subsequently, exposure is made to the position T (FIG. 4) in the upper right portion of the substrate W as seen from the above, encircled by a thick line, by use of a reticle pattern corresponding to the exposure region 21b.

After this, the substrate W is rotated clockwise by 30 degrees. Then, the alignment mark $M_{30}$ formed in the outside peripheral edge portion of the substrate W and being rotated counterclockwise by 30 degrees, is brought into a desired orientation as the rotation of the substrate W. Thus, alignment operation is made by using the alignment mark $M_{30}$ in this orientation. After this, exposure is made again to the position T in the upper right portion of the substrate W by using the reticle pattern corresponding to the exposure region 21b. Thereafter, the substrate W is rotated clockwise by 30 degrees (60 degrees in total), and alignment operation is made by using an alignment mark $M_{60}$, being rotated counterclockwise by 60 degrees. Then, exposure is made to position T, similarly.

In this manner, the substrate W is rotated repeatedly by 30 degrees and, in response to the unit rotation, an alignment mark having been pre-rotated counterclockwise by an angle corresponding to the rotation angle of the substrate W is brought into a desired orientation/position. Thus, by using these alignment marks sequentially, alignment operations are made sequentially and exposure (printing) of pattern to a predetermined position T (FIG. 4) is repeated. As a result of this procedure, for the exposure region 21b which is within a range of a diameter 22–41 mm and which is the second exposure region from the center of the element, the pattern exposure is completed with total twelve exposures in one complete turn (the exposure region 21b comprises a ring-like region having twelve segment regions).

For pattern exposure at a region closest to the center, since the range of exposure to be made by use of a picture field of 22 mm square is 90 degrees, a region up to about 22 mm is exposed by using the reticle 25. Namely, the substrate W is rotated stepwise by a unit angle of 90 degrees and, by using alignment marks $M_{00}$, $M_{90}$, $M_{180}$ and $M_{270}$ of corresponding angles, alignment of the exposure region 21a of the substrate as well as reticle pattern exposure to that region are executed. With this procedure, exposure operation to the circular region of a radius of about 22 mm is completed with four exposures. Finally, for the outermost peripheral pattern, since a range of 20 degrees can be exposed, the stepwise rotation is made in the unit of 20 degrees. Thus, by using alignment marks $M_{00}$, $M_{20}$, $M_{40}$, . . . , and $M_{340}$, alignment and exposure operation is made. The exposure operation for the outermost peripheral ring-like region is completed with eighteen exposures (this region comprises eighteen segment regions).

For manufacture of a diffractive optical element of multi-level structure, such as a binary optical element, with reference to each layer the substrate W may be rotated while binary patterns for corresponding work processes may be printed sequentially (see U.S. Pat. Nos. 4,895,790 and 5,156,943).

In a process after completion of patterning, the outside peripheral edge region AA where alignment marks are formed may be removed by cutting, and only the element portion may be used.

As described above, a suitable split shape and split number for exposure regions 21a–21c, for dividing the element into plural areas and for exposure of the same with rotation of the element, may be determined and, in addition to this, alignment marks corresponding to rotation angles of the substrate W may be formed beforehand in an outside portion of the concentric pattern. This enables patterning a revolutionary symmetric pattern over plural exposure regions 21a–21c with use of a least number of reticle patterns. Further, since there is no necessity of providing alignment marks within the diffractive optical element, alignment precision is not degraded and also the function of diffractive optical element is not damaged. Further, even if an alignment error occurs in the exposure process, an unnecessary resist pattern is not produced at the boundary between exposure regions 21a–21c.

Since a diffractive optical element produced as described has a function equivalent to a lens having a very high refractive index, it is very effective in the point of correction of aberrations. Particularly, where correction of chromatic aberration is to be made by use of a combination of a refractive lens and a diffractive optical element, an aspherical surface effect may be provided only by appropriately changing the pitch or shape of the diffractive optical element, to correct other monochromatic aberration (at least one of five Seidel aberrations).

Manufacture of a diffractive optical element requires fine work, and a lithographic process is used. A region which can be exposed by a single exposure in the lithographic size, even may be about 20 mm size, even when a finest pattern exposure apparatus is used. On the other hand, a projection optical system may have an effective diameter of about 100–200 mm. In order to utilize the characteristic of a diffractive optical element within a projection optical system of large numerical aperture (NA) for which a high resolving power is required, a fine pattern has to be patterned over a wide region of the diffractive optical element. In this respect, dividing the wide region into plural zones and forming a fine pattern of a diffractive optical element thereon, is very effective to accomplish a large numerical aperture and high resolving power projection optical system having a large diameter diffractive optical element.

Figure 5:
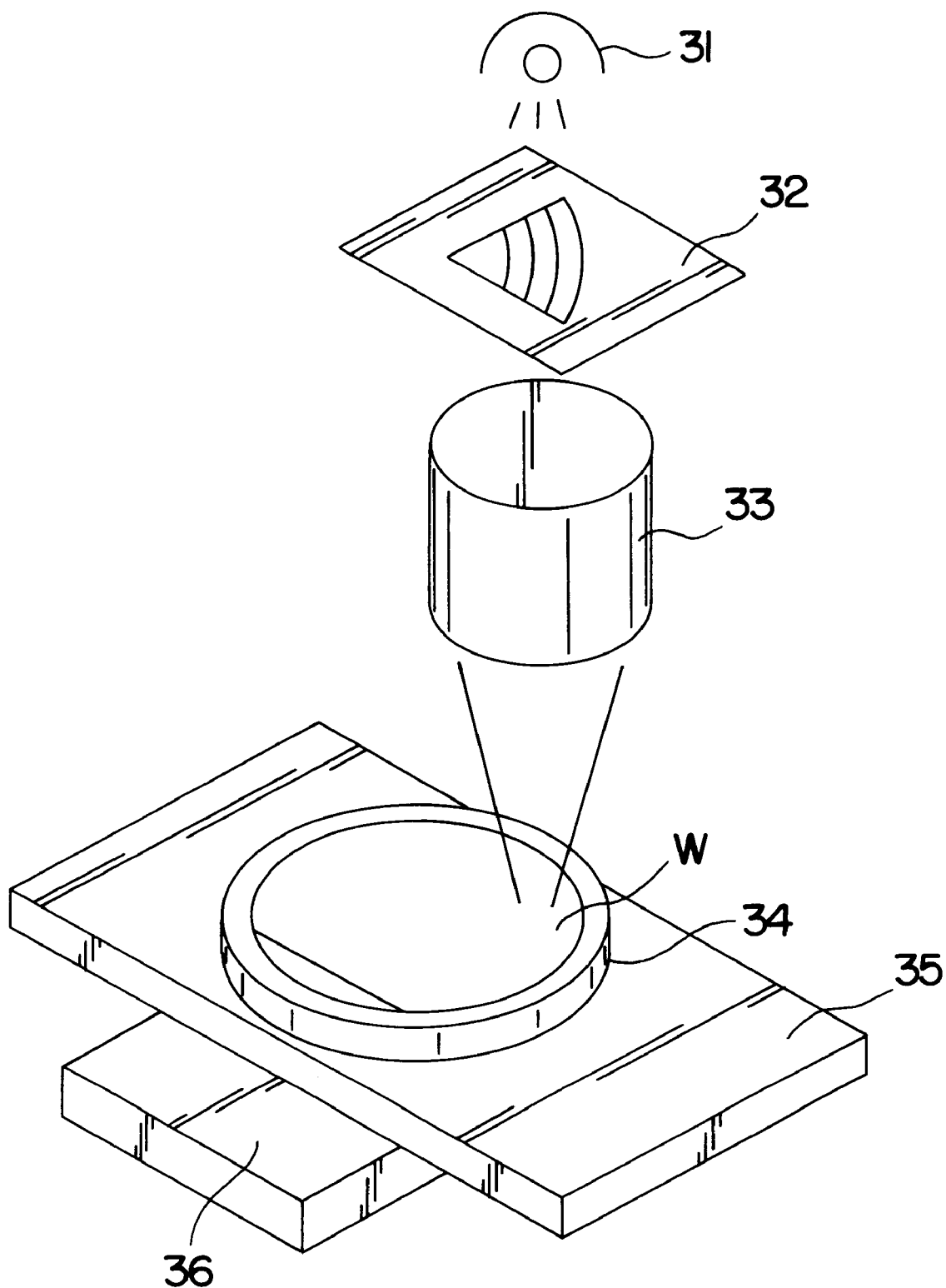
FIG. 5 is a schematic view of an exposure in a second embodiment of the present invention.
Figure 6:
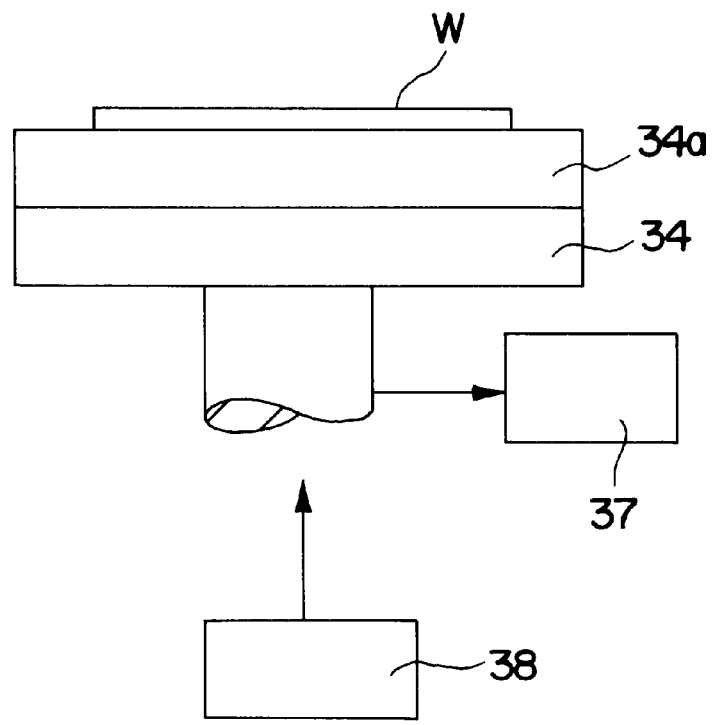
FIG. 6 is a schematic view of a rotary mechanism in the second embodiment of the present invention.

FIG. 5 is a schematic view of an exposure apparatus in a second embodiment of the present invention. Disposed below a light source 31 are a mask 32, a projection optical system 33, a rotary mechanism 34 having a substrate W placed thereon, and an X–Y stage mechanism 35 and 36. FIG. 6 is a side view of the rotary mechanism 34. The rotary mechanism 34 on the X–Y stage 35 and 36 has a fixing chuck 34a attached thereto. By this fixing chuck 34a, the substrate W is held on the rotary mechanism 34. To this rotary mechanism 34, a rotary encoder 37 and rotation control means 38 are connected.

In operation, first the X–Y stage 35 and 36 is actuated to adjust the position of the substrate W. The position of the substrate W is adjusted, and the substrate is placed at a position where it can be exposed to the mask 32 with light from the light source 31. Upon completion of position adjustment, patterning of the substrate W being coated with a material sensitive to the wavelength of light from the light source 31 is performed by exposure. When the patterning is completed, the substrate W is rotated by the rotary mechanism 34 by an angle corresponding to an apex angle of a representative pattern of fan-like shape of the mask 32, and exposure is made again. Subsequently, the substrate W is position adjusted by means of the X–Y stage 35 and 36 to a predetermined position along the radial direction. After the position adjustment is completed, exposure-is made. After this exposure, rotation of the substrate W and exposure of the same are repeated. With this procedure, for an example where the representative pattern of the mask 32 has an apex angle 90 deg., concentric patterns are provided with four repeated operations.

The substrate W can be adjusted to any desired angle by means of the rotary mechanism 34 while it is being held by the chuck 34a. The rotation angle of it is monitored by the rotary encoder 37. In accordance with the peak angle of the fan-shaped representative pattern of the mask 32, the rotation control means 38 discriminates consistency of these angles, and it controls the rotation.

Figure 7:
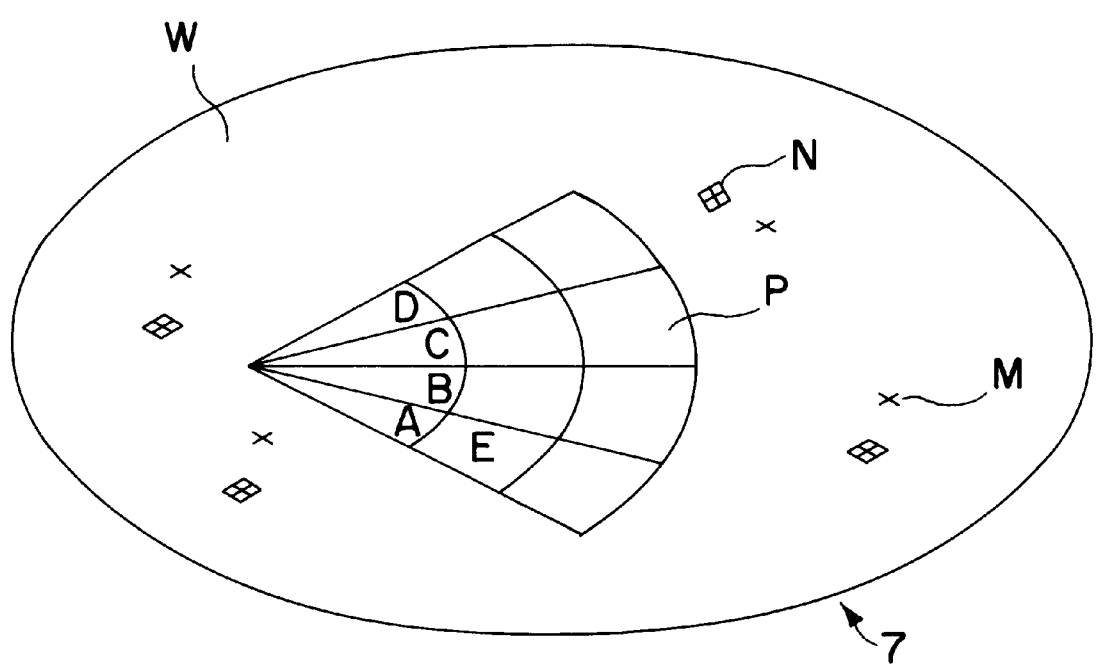
FIG. 7 is a schematic view for explaining division exposure wherein a pattern center and a rotation center do not coincide with each other.
Figure 8:
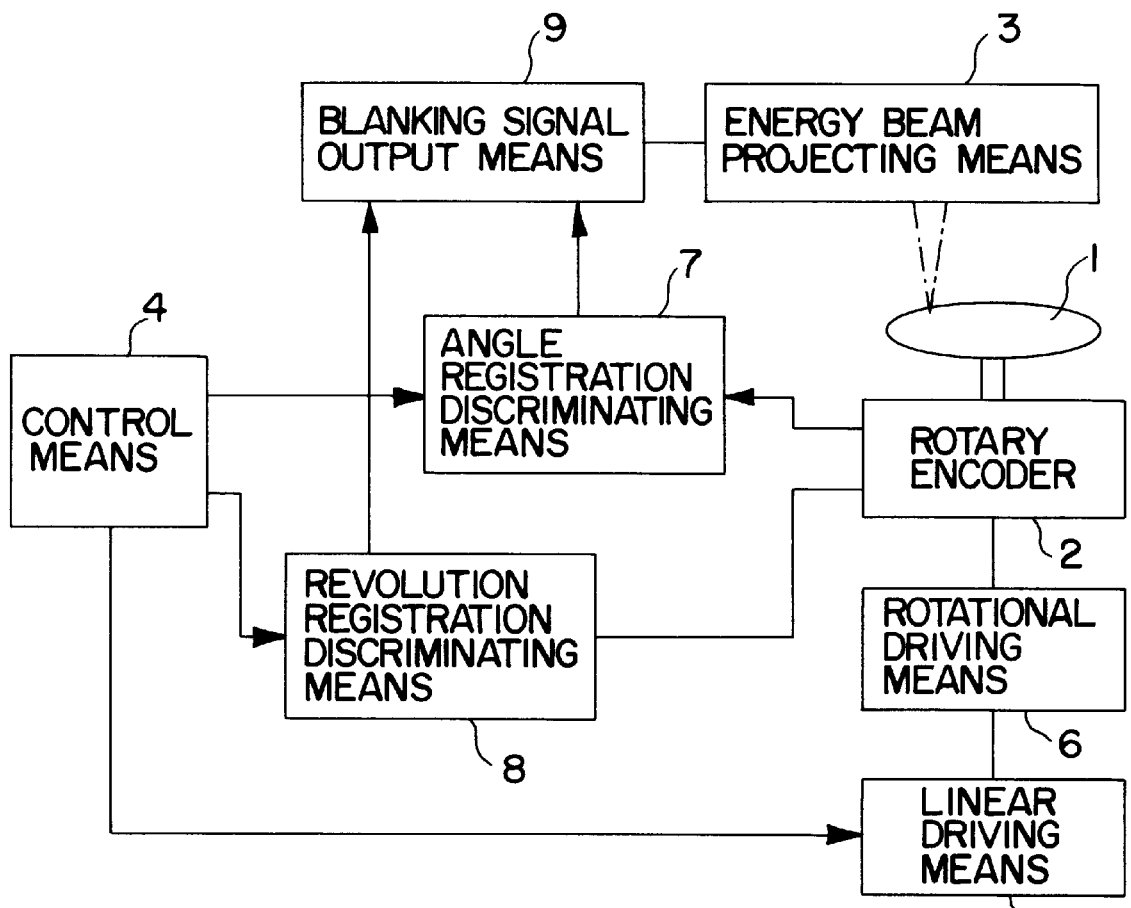
FIG. 8 is a block diagram of conventional rotary stage system.

In the apparatus of this embodiment, the X–Y orthogonal coordinate system for the patterning can be rotated by any angle. Thus, as shown in FIG. 7, for example, exposure can be made even in an occasion where the center of the pattern P to be printed by split exposure is out of coincidence with the center of the stage of the rotary mechanism 34 an which the substrate W is placed.

In that occasion, first, by using a single coordinate system, an alignment mark M necessary for subsequent processes is patterned. By using the alignment mark M having predetected coordinates, the position an the substrate W is detected and a grating pattern is printed on the region A. Subsequently, under a coordinate system being rotated by a predetermined angle with respect to the coordinate system of the alignment mark M, by using an alignment mark N having predetected coordinates, the position on the substrate W is detected and a grating pattern is printed an the region B. After this, while not shown in the drawing, alignment marks M with coordinate systems corresponding to regions C and D are prepared, and patterning of these regions C and D is carried out. Also, in a similar manner, patterning is done with respect to a region (e.g., region E) contiguous thereto in radial direction.

As described above, an optical element having a concentric pattern can be produced in accordance with a process wherein a substrate is sequentially exposed by use of the same reticle pattern while rotating the substrate. As a result, the element has a good pattern continuity and high positioning precision.

In the optical element manufacturing method described above, for exposure of a wide area, revolutionary symmetry of the element pattern is utilized, and a reticle is prepared with a pattern of a portion of exposure region. Sequential exposures are made while rotating the substrate. This enables exposure of ring-like regions being divided radially, by use of one reticle. As a result, efficient patterning of a wide area with a small number of reticles is assured.

When a high precision diffractive optical element as produced in accordance with the procedure described above is incorporated into a projection optical system of a projection exposure apparatus of a type such as disclosed in U.S. Pat. No. 4,895,790 or 5,156,943, for example, the optical system provides good optical performance.

In accordance with the optical element manufacturing method described above, concentric patterns can be exposed efficiently. Particularly, for exposure of a concentric pattern of a radius larger than the region size which can be exposed by a single exposure, the exposure can be done with determination of a representative pattern. Thus, it is possible to provide a large size element (large diameter optical element) having good position precision.

In accordance with the optical element manufacturing apparatus described above, a constant area can be exposed with a single exposure and, on the other hand, the substrate can be exposed while being rotated at desired angles. Thus, the work efficiency is very high and, since the position adjustment is static, high precision is assured.

While the invention has been described with reference to the structures disclosed herein, it is not confined to the details set forth and this application is intended to cover such modifications or changes as may come within the purposes of the improvements or the scope of the following claims.

What is claimed is :

1. A method of manufacturing an element with a concentric pattern by use of a photolithographic process, said method comprising the steps of:

preparing masks having segment patterns, each segment pattern being formed on a fan-shaped pattern area of a corresponding mask, the segment patterns corresponding to fan-shaped regions of the concentric pattern, and the fan-shaped regions being defined by dividing the concentric pattern by at least one circle concentric with the concentric pattern and straight lines extending radially from the center of the concentric pattern; and exposing a substrate by using each of the masks while rotating the substrate about an axis corresponding to the center of the concentric pattern.

2. A method according to claim 1, wherein the element is an optical element.

3. A method according to claim 2, wherein the optical element is a diffractive optical element.

4. A method according to claim 3, wherein the diffractive optical element is a binary optical element.

5. A method according to claim 1, wherein said exposing step includes aligning, before illuminating a mask, an area of the substrate which is in a portion of a region of the fan-shaped region, with respect to the mask.

6. A method according to claim 5, wherein, at a boundary of two adjacent fan-shaped regions, the two adjacent fan-shaped regions include overlapping portions of an amount larger than the precision of alignment.

7. A method according to claim 5, wherein the substrate is formed with alignment marks which are formed in a region, outside the fan-shaped regions, and which are rotationally displaced by the regular angles, respectively, in a direction opposite to the direction of rotation of the substrate.

* * * * *

UNITED STATES PATENT AND TRADEMARK OFFICE
CERTIFICATE OF CORRECTION

PATENT NO. : 6,083,650

DATED : July 4, 2000

INVENTOR(S): Makoto OGUSU, et al.                    Page 1 of 3

It is certified that error appears in the above-identified patent and that said Letters Patent is hereby corrected as shown below:

ON THE COVER PAGE:

Insert: --[*] Notice: This patent issued on a continued prosecution application filed under 37 C.F.R. § 1.53(d), and is subject to the twenty year patent term provisions of 35 U.S.C. § 1.54(a)(2).--.

At [57], Abstract:

Line 8, "and-exposing" should read --and exposing--.

COLUMN 1:

Line 9, "In" should read --in--.
Line 14, "rating" should read --grating--.
Line 33, "are-connected" should read --are connected--.

COLUMN 2:

Line 24, "plane" should read --plan--.
Line 58, "region" (second occurrence) should read --regions--.

UNITED STATES PATENT AND TRADEMARK OFFICE
CERTIFICATE OF CORRECTION

PATENT NO. : 6,083,650

DATED : July 4, 2000

INVENTOR(S) : Makoto OGUSU, et al.

It is certified that error appears in the above-identified patent and that said Letters Patent is hereby corrected as shown below:

COLUMN 3:

Line 15, "error" should read --error being--.
Line 18, "which-is" should read --which is--.
Line 35, "the" (second occurrence) should be deleted.
Line 53, "to" should read --by--.
Line 59, "a" should read --an--.
Line 60, "the" (second occurrence) should be deleted.

COLUMN 4:

Line 30, "total" should read --a total of--.
Line 47, "operation is" should read --operations are--.

COLUMN 5:

Line 19, "aberration" should read --aberrations--.
Line 23, "size," should be deleted.
Line 24, "even" should be deleted.
Line 62, "exposure-is" should read --exposure is--.
Line 64, "an" should be deleted.

UNITED STATES PATENT AND TRADEMARK OFFICE
CERTIFICATE OF CORRECTION

PATENT NO. : 6,083,650

DATED : July 4, 2000

INVENTOR(S): Makoto OGUSU, et al.

It is certified that error appears in the above-identified patent and that said Letters Patent is hereby corrected as shown below:

COLUMN 6:

Line 13, "an" should read --on--.
Line 24, "an" should read --on--.

Signed and Sealed this

Twenty-second Day of May, 2001

Attest:

NICHOLAS P. GODICI

*Attesting Officer*   Acting Director of the United States Patent and Trademark Office